United States Patent
Feldman

(10) Patent No.: US 6,794,625 B2
(45) Date of Patent: Sep. 21, 2004

(54) DYNAMIC AUTOMATIC FOCUSING METHOD AND APPARATUS USING INTERFERENCE PATTERNS

(75) Inventor: Haim Feldman, Nof-Ayalon (IL)

(73) Assignee: Applied Materials, Santa Clara, CA (US)

(*) Notice: Subject to any disclaimer, the term of this patent is extended or adjusted under 35 U.S.C. 154(b) by 130 days.

(21) Appl. No.: 09/855,253

(22) Filed: May 15, 2001

(65) Prior Publication Data
US 2002/0171028 A1 Nov. 21, 2002

(51) Int. Cl.[7] ............................................. G02B 27/40
(52) U.S. Cl. ............................... 250/201.2; 250/201.9
(58) Field of Search ................. 250/201.2, 201.7–201.9, 250/237 R; 356/482, 499

(56) References Cited

U.S. PATENT DOCUMENTS

| | | | |
|---|---|---|---|
| 4,123,652 A | 10/1978 | Bouwhuis | 250/204 |
| 5,338,924 A | * 8/1994 | Barrett et al. | 250/201.4 |
| 5,563,702 A | 10/1996 | Emery et al. | 356/73 |
| 5,572,323 A | 11/1996 | Maeda et al. | |
| 6,124,924 A | 9/2000 | Feldman et al. | |

* cited by examiner

Primary Examiner—Thanh X. Luu
(74) Attorney, Agent, or Firm—Sughrue Mion LLP

(57) ABSTRACT

Method and apparatus to enable detection of a position of an article, and thereby enable maintenance of a desired position thereof. The apparatus includes an illumination unit, focusing optics and a focus detection unit, the focusing optics serving to direct incident light toward the article and directing light returned from an illuminated elongated region on the article toward the focus detection unit. The focus detection unit includes an optical system that collects the returned light passed through the focusing optics and creates at least two images in the form of at least two interference patterns, respectively, on the sensing surface of a detector. The first interference pattern is created by interference of light components of the collected light that propagated within a first periphery region of an optical axis of the focusing optics and light components of the collected light that propagated within a paraxial region of the optical axis. The second interference pattern is created by interference between light components of the collected light that propagated with a second periphery region of the optical axis, symmetrical to the first periphery region with respect to the optical axis. and light components of the collected light that propagated within the paraxial region. Data indicative of a relation between intensity profiles in the two interference patterns is utilized to determine the location of the article relative to the focal plane.

19 Claims, 8 Drawing Sheets

DYNAMIC AUTOMATIC FOCUSING METHOD AND APPARATUS USING INTERFERENCE PATTERNS

FIELD OF THE INVENTION

This invention is in the field of auto-focusing techniques and relates to a method and apparatus enabling focus error correction to maintain a desired position of an article.

BACKGROUND OF THE INVENTION

There are a number of optical systems utilizing focus error correction techniques. Such optical systems, which typically comprise an illumination system equipped with suitable light directing optics and a detection system equipped with light collecting optics, are used for inspection/measurements of articles, reading/recording information in an information carrier, etc. The focus error correction technique ensures that the article under inspection (or an addressed layer of the information carrier) is located in a focal plane defined by the light directing optics.

According to one conventional auto-focusing technique disclosed, for example, in U.S. Pat. Nos. 4,123,652 and 5,563,702, a light beam scattered from an article is directed through anamorphic elements, and the shape of the light beam cross-section after passing these elements is monitored. The basic principle underlying the implementation is that a cylindrical lens produces astigmatism. A focused beam is first displaced from an in-focus point in a first direction, and then in a second direction perpendicular to the first direction. The beam cross section therefore changes from being oblong in the first direction, to being circular, to being oblong in the second direction. Thus, an auto-focus beam is typically split into a pair of sub-beams, which propagate along mutually perpendicular optical paths onto a pair of detectors through a pair of astigmatic elements, respectively. The detectors are quadrature photodiodes. When the article is in focus, both detectors are illuminated by a circular beam. As the article goes out of focus, the horizontal diameter of the beam decreases on one detector and increases on the other.

This changes the electrical output from the quadrature detectors and the focus correction signal is thus calculated accordingly.

SUMMARY OF THE INVENTION

There is a need in the art to facilitate focus error correction by providing a novel method and apparatus utilizing a dynamic auto-focusing technique. The present invention enables the detection of a position of the plane defined by an article under processing relative to the focal plane of an optical system, thereby enabling maintenance of accurate focusing of an incident beam from the optical system to the article.

The term "processing" used herein signifies any procedure applied to the article during which the article should be maintained in a preset plane. This procedure may be inspection, information reading/recording, etc.

One aspect of the present invention is based on the detection of at least two interference patterns formed by light components returned from an elongated illuminated region on the article and passing through at least two symmetrical peripheral regions of the optical axis of a focusing/collecting lens arrangement. The term "periphery regions" used herein signifies regions of light propagation along an optical axis of the lens making substantially large angles to and lying substantially far from the optical axis (as compared to paraxial regions of the optical axis).

Each of the interference patterns is created by interference between collected light formed of light components propagating within one of the periphery regions and collected light formed of light components propagating within the paraxial regions of the optical axis. The relation between the interference patterns is indicative of the phase difference between the collected light formed of light components propagating within the paraxial and periphery regions, and consequently, of the out-of-focus position of the illuminated region.

One concept underlying the present invention is based on the following known phenomena. Light waves returned from in-focus and out-of-focus planes and passed through a focusing lens have substantially flat and spherical wave fronts, respectively. Consequently, information indicative of distortions produced at any out-of-focus location is actually that contained in light propagating within a periphery region of the optical axis, rather than that associated with a paraxial area. Hence, it is desired to analyze light components propagating within the periphery regions, to detect the focus error. On the other hand, light components propagating within the paraxial and periphery regions of the optical axis have different optical paths, respectively, and therefore have a certain phase difference indicative of the out-of-focus position of the article.

In the inventive apparatus, the same focusing optics (typically composed of one or more objective lens) directs incident light onto an elongated region of the article, and collects light returned from the illuminated elongated region. This focusing optics presents an aperture stop whose physical dimensions define the collected light portion. Collected light, which contains information of the illuminated region and of the aperture stop, enters a focus detection unit, and is directed towards the sensing surface of a detector through an optical system.

When the collected light passes through the optical system, an image of the aperture stop is first created (by a first lens arrangement) in a plane conjugate to the aperture stop plane and extending in an X-Y plane perpendicular to the optical axis of light propagation through the optical system. Then, at least three spatially separated light components are picked up (selected) from the light indicative of this image by appropriately locating at least three slits in the image plane, and are imaged onto the sensing surface of the detector by suitable optics (second and third lens arrangements). The slits are accommodated such that at least one of the selected light components contains light propagated within the paraxial region of the optical axis of the focusing/collecting optics, and the at least two other light components contain light propagated within two symmetrical periphery regions of the optical axis. The slits are made in a blocking plate (located in the X-Y plane), extend along the X-axis (parallel to the elongated illuminated region), and are aligned in a spaced-apart parallel relationship along the Y-axis, such that the optical axis of the optical system intersects with an axis of the at least one central slit.

The central slit may be relatively long, extending across the entire blocking plate, or may be in the form of a two-part slit, the two parts being spaced apart from each other along the X-axis and being spaced from at least two side slits along the Y-axis. The side slits may be relatively short (as compared to the long central slit). The side slit(s) located at opposite sides of the central slit are centrally symmetrical relative to the intersection point between the slits' plane and the optical axis of the optical system, and are spaced from each other along both the X- and Y-axes.

According to one embodiment of the invention, there are provided two side slits located at opposite sides of the central slit. In this case, two interference patterns are created.

According to another embodiment of the invention, two pairs of side slits are located at respective opposite sides of the central slit. In this manner, a dynamic range of the detected signals can be extended. The slits of each pair may be spaced from each other along the Y-axis only, in which case two interference patterns are created, or may be spaced from each other along both the X- and Y-axis, in which case two pairs of interference patterns are created.

The slits are sufficiently thin to cause the diffraction of light emerging from the slits. Two interference patterns are created on the sensing surface by the interference between, respectively, the diffracted light ensuing from the upper slit(s) and the respective half (or part) of the central slit, and the diffracted light ensuing from the lower slit(s) and the other half (or part) of the central slit.

When the article is in focus, the two patterns are spaced from each other only along the X-axis, namely each two corresponding "dark" fringes and each two corresponding "light" fringes in the patterns are aligned in two lines, respectively. This is the so-called "best focus image".

When the article goes out of focus, the optical paths of the collected light components change, and, consequently, a phase difference is created between the light components emerging from the central and upper slits, as well as between the central and lower slits. This causes the interference pattern to move up and down on the sensing surface of the detector. The two imaged interference patterns are formed by light components propagating symmetrically with respect to the optical axis. Therefore, images corresponding to the before-focus and after-focus locations of the illuminated region (line) displace into two opposite directions, respectively, relative to the "best focus image". In other words, when one interference pattern moves up, the other pattern moves down and vice versa. By estimating the phase difference between the two patterns, the focus error can be estimated.

By equipping the apparatus with a feedback loop, typically consisting of a suitable processor interconnected between an output circuit of the detector and a servomotor coupled to the article support stage or/and to the focusing optics, it is possible to perform focus error correction successfully.

There is thus provided, according to one aspect of the present invention, an optical apparatus for determining a position of an article, the apparatus comprising an illumination unit, focusing optics and a focus detection unit, wherein:

the illumination unit is operable to generate incident light and illuminate an elongated region of the article for producing light returned from the illuminated region;

the focusing optics directs the incident light toward the article and directs at least a portion of the returned light towards the focus detection unit; and the focus detection unit comprises an optical system and a detector, the optical system being operable to collect the directed portion of the returned light and create at least two images on a sensing surface of the detector in the form of at least two interference patterns, respectively, wherein at least one pattern is created by interference between light components of the collected light that propagated within a first periphery region of an optical axis of the focusing optics and light components of the collected light that propagated within a paraxial region of said optical axis, and at least one other interference pattern is created by interference between light components of the collected light that propagated within a second periphery region of said optical axis, substantially symmetrical to said first periphery region with respect to said optical axis, and light components of the collected light that propagated within the paraxial region of said optical axis, data representative of a relation between intensity profiles in the at least two interference patterns being indicative of the position of the article relative to a focal plane of said focusing optics.

According to another aspect of the present invention, there is provided a focus error detection method comprising:

passing incident light through focusing optics and illuminating an elongated region, thereby producing light returned from the illuminated region;

collecting at least a portion of the light returned from said illuminated region and passed through said focusing optics;

picking up at least three spatially separated light components of the collected returned light, to cause diffraction of each of said light components and to allow interference between a central light component that propagated within a paraxial region of an optical axis of the focusing optics and at least one first light component that propagated within a first periphery region of said optical axis of the focusing optics, and interference between said central light component and at least one second light component of the collected returned light that propagated within a second periphery region of said optical axis of the focusing optics substantially symmetrical to said first periphery region with respect to said optical axis; and creating at least two images in the form of at least two interference patterns, respectively, on a sensing surface of a detector, said at least two interference patterns being created by the interference of the separated light components, a relation between intensity profiles in the interference patterns being indicative of the position of the illuminated region relative to a focal plane of said focusing optics.

The present invention may be used with an optical inspection system, by simply adding a separate detection-collection means for collecting light returned from the illuminated region at elevation angles other than that collected by the focusing optics. There is no need for a separate illumination unit, though one may be provided if desired.

Thus, according to yet another aspect of the present invention, there is provided a system for an optical inspection of an article, comprising an optical apparatus for maintaining a desired position of the article, and at least one detection unit, wherein said optical apparatus comprises:

an illumination unit operable to generate incident light and illuminate an elongated region of the article for producing light returned from the illuminated region;

focusing optics that directs the incident light towards the article and directs at least a portion of the returned light towards a focus detection unit;

said focus detection unit comprising an optical system and a detector, the optical system being operable to collect the directed portion of the returned light and create at least two images on a sensing surface of the detector in the form of at least two interference patterns, respectively, wherein at least one pattern is created by interference between light components of the collected light that propagated within a first periphery region of an optical axis of the focusing optics and light components of the collected light that propagated within a paraxial region of said optical axis, and at least one other interference pattern is formed by interference between light components of the collected light that propagated within a second periphery region of said optical axis, substantially symmetrical to said first periphery region with respect to said optical axis, and light components of the collected light that propagated within the paraxial region of said optical axis of the focusing optics, data indicative of a relation between intensity profiles in the at least two interference patterns being indicative of the position of the article relative to a focal plane of the focusing optics; and said at least one detection unit comprises a light collecting optics and a detection means, the light collecting optics being capable of collecting light returned from the article at elevation angles different from an elevation angle of collection of said at least portion of the returned light defined by said focusing optics.

According to yet another aspect of the present invention, there is provided a method of maintaining a desired position of an article during processing of the article, the method comprising:

(a) generating an incident beam and illuminating an elongated region of the article to produce light returned from the illuminated region;

(b) directing the incident light towards the article through a focusing optics, and collecting with said focusing optics at least a portion of the returned light and directing it towards a focus detection unit, said focusing optics defining an aperture stop of light collection;

(c) creating from the collected returned light at least two images of the illuminated region in the form of at least two interference patterns, respectively, said at least two interference patterns being formed by the interference between a central light component of the collected light that propagated within a paraxial region of an optical axis of the focusing optics and at least one first light component of the collected light that propagated within a first periphery region of the optical axis of the focusing optics, and interference between said central light component and at least one second light component of the collected light that propagated within a second periphery region of the optical axis of the focusing optics substantially symmetrical to said first periphery region with respect to said optical axis;

(d) detecting light indicative of said at least two images and generating data representative thereof, and (e) analyzing the generated data to determine a relation between intensity profiles in the at least two interference patterns, and determining a relative position of the article with respect to a focal plane of the focusing optics, thereby enabling maintenance of the desired position of the article.

One embodiment of the present invention may be used with an optical inspection system for inspecting wafers, and is therefore described as such below, by way of an exemplary implementation. It is within the contemplation of the invention to provide other implementations as well, involving systems for inspecting other kinds of articles, including other nontranslucent articles, or reticles.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF A PREFERRED EMBODIMENT

Figure 1:
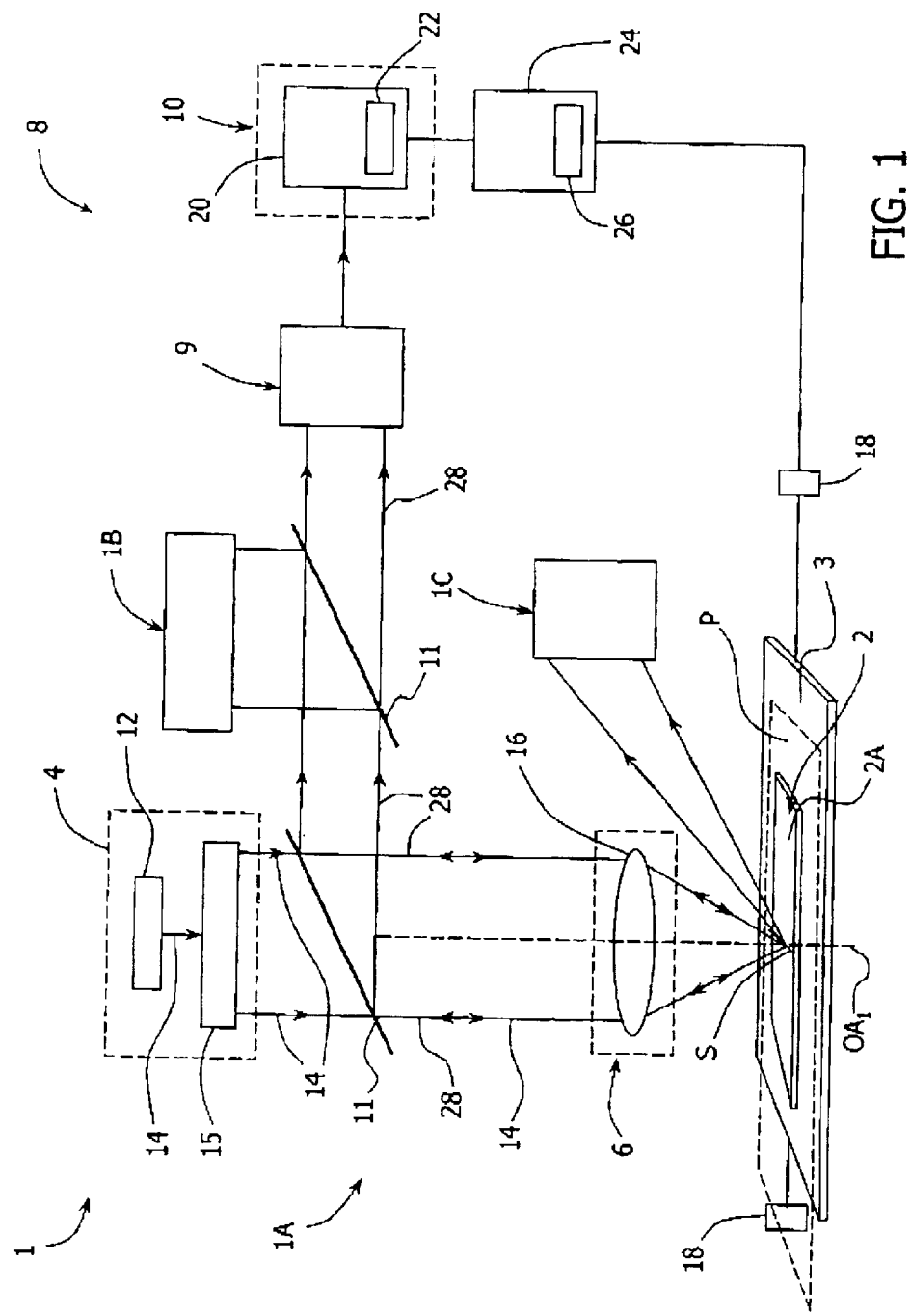
FIG. 1 is a schematic illustration of the main components of an article inspection system utilizing an apparatus according to the invention.

FIG. 1 shows an optical inspection system 1 associated with a wafer 2 to be inspected. The wafer 2 is typically located on a support stage 3 which translates the wafer within an inspection plane. The system 1 comprises a scanning apparatus 1a defining an auto-focusing channel, and bright-field and dark-field detection units 1b and 1c associated with inspection channels. The construction and operation of the detection units 1b and 1c are known, and therefore need not be specifically described, except to note the following. The dark-field detection unit 1c comprises a suitable detector and appropriately oriented collecting optics. The bright field detection unit 1b includes a pin-diode (not shown) receiving a part of returned radiation collected with the scanning apparatus 1a. It should be understood that, generally, either a bright-field inspection channel or a dark-field inspection channel, or both, could be used for inspection purposes.

The scanning apparatus 1a comprises an illumination unit 4, focusing-collecting optics 6, and a focus detection unit 8. The unit 8 comprises an optical system 9 and a detector 10 together constituting the auto-focusing channel, the construction and operation of which will be described more specifically further below with reference to FIG. 2.

A beam splitter 11 separates the incident and returned radiation, and directs the returned radiation towards the optical system 9. According to the present example, the beam splitter 11 is in the form of a partially transparent mirror that transmits and reflects radiation impinging thereon from two opposite directions, respectively. The beam splitter 11 transmits incident radiation and reflects returned radiation. Alternatively, a polarizing beam splitter equipped with phase-shifting plates may be used.

The illumination unit 4 comprises a laser source 12 emitting an incident beam 14, and a deflector 15 (which may be an acousto-optic element, a mirror, or the like) causing the beam 14 to scan along a surface 2a of the wafer 2. It should be noted that a linear beam could be used for the same purpose, i.e., for illuminating an elongated region on the surface 2a.

The focusing-collecting optics 6 is typically an objective lens system 16 (which could be one or a plurality of objective lenses). The objective lens system 16 focuses the deflected beam 14 onto a scan line S (constituting the elongated region) on the surface 2a, and collects a portion of the returned light.

A servomotor 18 is coupled to the stage 3 for driving a movement of the stage along an optical axis OA1 of the lens system 16 to change the position of its focal plane P relative to the surface 2a. Alternatively or additionally, a similar servomotor may be associated with the part or all of illumination unit 4, or the lens system 16. Relative movement between the surface 2a and the beam 14, however achieved to effect scanning is within the contemplation of the invention.

The detector 10 comprises a charge coupled device (CCD) camera 20 having a plurality of sensing elements (not shown) that typically detect light signals and generate electrical output representative thereof to be transmitted through an output circuit 22 of the detector. The sensing elements define together a sensing surface 21 (shown schematically in FIG. 2).

Interconnected between the servomotor 18 and the output circuit 22 is a processor 24. The construction and operational principles of the processor 24 may be of any known kind. However, it should be noted that the processor 24 is responsive to the output of the detection unit 10 for analyzing the location of the surface 2a relative to the focal plane P and generating a focus error correction signal, upon detecting that the surface 2a moves away from the focal plane P. Thus, the CCD output circuit 22, processor 24 and servomotor 18 constitute together a feedback loop. The processor 24 is optionally provided with a display 26 for displaying obtained images.

Also provided in the system 1 is a beam splitter 27 accommodated in the optical path of the collected returned light reflected from the mirror 11. The beam splitter 27 is a semi-transparent mirror that partly transmits and partly reflects radiation impinging thereon. Hence, the mirror 27 reflects a part of the collected radiation towards the detection unit 1b, while transmitting the other part of the collected radiation towards the focus detection unit 8.

The incident beam 14 propagates through the beam splitter 11 and objective lens 16, and illuminates the line S, while being focused onto the focal plane P, which occasionally may not coincide with the surface 2a. The beams' propagation is shown here schematically to facilitate the illustration of the main components and operational principles of the apparatus 1a. A light portion, generally at 28, returned (reflected) from the scan line S, is collected by the lens system 16. The lens system 16 may include an aperture stop that defines the collected light portion 28. The collected light 28 is reflected to the mirror 27, which allows the transmission of the part of light 28 towards the detector 10 through the optical system 9, and reflects the other part of light 28 towards the detection unit 1b. The optical system 9 forms images indicative of the position of the surface 2a relative to the focal plane P on the sensing surface 21.

Figure 2:
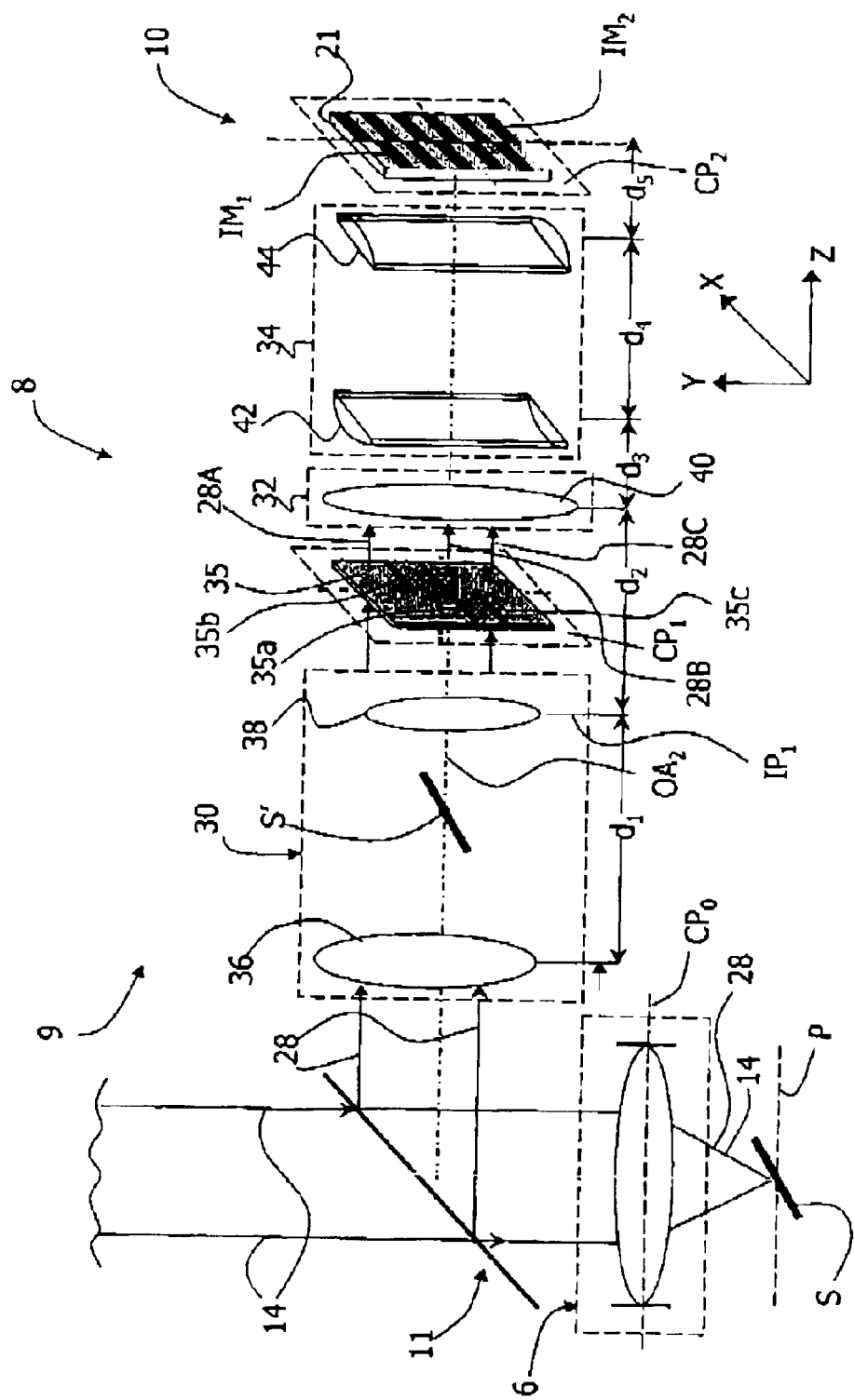
FIG. 2 schematically illustrates the main constructional elements of a focus detection unit of the apparatus of FIG. 1 utilizing a blocking plate according to one example of the invention.

FIG. 2 shows more detail of the construction of one implementation of the focus detection unit 8. The optical system 9 comprises three functionally different lens arrangements, generally designated 30, 32 and 34, respectively, and a blocking plate 35 interposed between the lens arrangements 30 and 32. The lens arrangements define a common optical axis $OA_2$ of light propagation through the optical system 9. The plate 35 is oriented perpendicularly to the optical axis $OA_2$, i.e., in the X-Y plane.

The plate 35 is formed with three slits 35a, 35b and 35c aligned in a spaced-apart parallel relationship along the Y-axis, the slits 35a and 35b being also spaced with respect to each other along the X-axis. A different number of slits may be desired, depending on the application. The slits may be considered thin, being about 51 μm wide. The three slits represent three transmitting regions, respectively, surrounded by blocking regions of the plate 35, thereby picking up three light components from light impinging onto the plate 35 and transmitting them towards the lens arrangement 32. The central slit 35b may extend substantially across the entire plate 35. In this embodiment, the upper and lower slits 35a and 35c are short (as compared to the central slit) and are located centrally symmetrically relative to an intersection point $IP_1$ between the plate 35 and the optical axis $OA_2$. The purpose of such a slit arrangement will be explained further below.

The back reflected light 28 is directed by the beam splitter 11 towards the lens arrangement 30. The lens arrangement 30 comprises two lenses 36 and 38 with focal lengths of 200 mm and 80 mm, respectively, spaced from each other a distance $d_1$ ($d_1$=280 mm). Obviously, other lenses with different focal lengths and spacings may be used. It should also be noted that the illustration is schematic, and does not proportionally correspond to the actual distances between the elements of the unit 8, in order to facilitate the illustration of some elements of the system, such as plate 35 and sensing surface 21 of the camera. The lenses 36 and 38 operate together to image the aperture stop 16 onto a slits' plane $CP_1$. That is, lenses 36 and 38 operate in a telescopic mode to form a magnified image of the aperture stop 16 in the plane $CP_1$. A plane $CP_0$, defined by the location of the aperture stop 16 ("object"), and the slits' plane $CP_1$ are conjugate planes, i.e., are the images of each other.

The image magnification is required to adapt the exit pupil size (i.e., the size of the aperture stop 16) to the target size (i.e., the sensing surface 21 of the CCD camera 20). As shown in the figure, S' is an image of the scan line S formed by the lens 36. Generally speaking, the arrangement 30, in combination with the beam splitter 11, represents a translation matrix to move image formation away from optical interfaces defined by the focusing optics 6.

The plate 35 is accommodated within the conjugate plane $CP_1$ at the location of the expected magnified image of the aperture stop 16. Since light impinging onto the plate 35 is the "image" of the aperture stop 16, it contains the same information of the out-of-focus distortions as the "object"

light 28 impinging onto the aperture stop 16. Light coming from the plate 35 is in the form of three spatially separated light components 28a, 28b and 28c representative of the image of the aperture stop 16.

The lens arrangement 32 consists of a spherical lens 40 (or a plurality of such lenses), that forms an image of the scan line S along the Z-axis in its focal plane. The lens 40, which in this embodiment has a 200 mm focal length and is located in the focal plane of the lens 38, i.e., is spaced from lens 38 a distance $d_2$ equal to 80 mm. The lens arrangement 32 and the CCD camera 20 are accommodated such that the sensing surface 21 of the camera is located in a focal plane $CP_2$ of the lens arrangement 32 conjugate to the plane $CP_0$ along the X-axis (i.e. parallel to the scan line S). Obviously other lenses with different focal lengths and spacings may be used.

The lens arrangement 34 comprises an appropriate number of cylindrical lenses—two in the present example—designated respectively 42 and 44, which operate together to form an image of the slits in the plane $CP_2$. The slits' image along the X-axis is magnified in order to be projected onto the entire sensing surface 21. Each of the lenses 42 and 44 has a 50 mm focal length. Lens 42 is spaced from lens 40 a distance $d_3$ equal to 50 mm, and from lens 44 a distance $d_4$ equal to 100 mm. Again, different numbers of lenses, with different focal lengths and spacings, may be used.

Figure 3A:
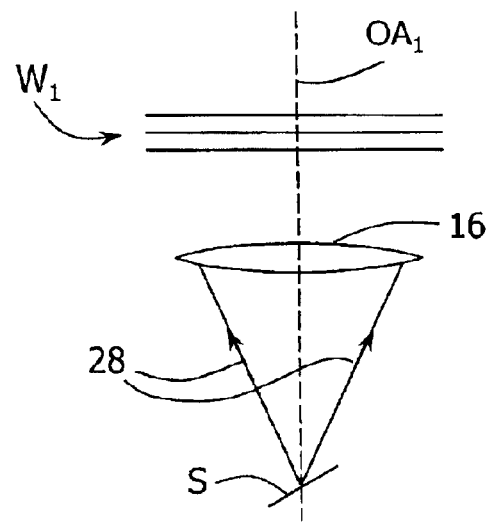
FIGS. 3a and 3b illustrate the main principles underlying the implementation of an auto-focusing technique in the unit of FIG. 2.
Figure 3B:
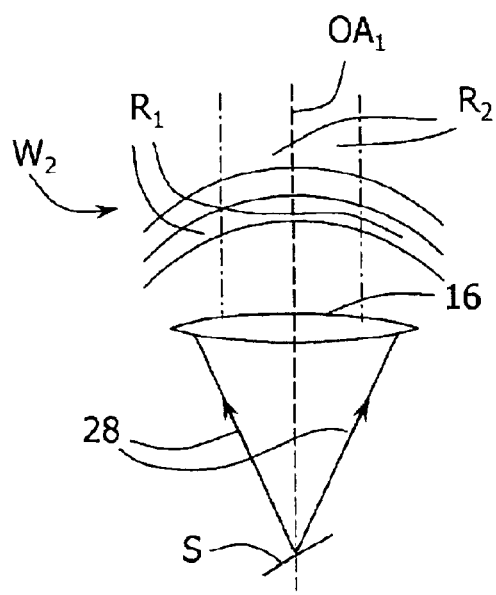

FIGS. 3a and 3b illustrate principles of light propagation from in-focus and out-of-focus positions, underlying the above design of the optical system 9. FIG. 3a illustrates a wave front $W_1$ of returned light 28 passed through the aperture stop 16 corresponding to an in-focus location of the illuminated line S. The in-focus location is typically characterized by a substantially flat-shaped wave front $W_1$.

FIG. 3b illustrates a wave front $W_2$ of the returned light 28 corresponding to an out-of-focus location of the illuminated line S. The out-of-focus location is characterized by a substantially spherical wave front $W_2$. The returned light 28 propagates within regions $R_1$ and $R_2$, which lie substantially far from and close to the optical axis $OA_1$, respectively, i.e., periphery and paraxial regions, respectively, with respect to the optical axis $OA_1$. Significant curvatures of the wave front $W_2$ are located within the periphery regions $R_1$, while being relatively negligible within the paraxial regions $R_2$. The periphery regions of the lens are more sensitive to an out-of-focus position of the light source. Therefore, detected light formed by light components propagating within the periphery regions $R_1$ contains the main information indicative of the out-of-focus location of the line S. This is associated with the principles of light propagation through a lens: with respect to rays coming from the same point on the optical axis of the lens and impinging on the lens at different distances from the optical axis, the further a ray emerges from the optical axis of the lens, the more strongly it is refracted.

It should be understood that since the light beams coming from spaced-apart locations on the optical axis (i.e. before-focus, in-focus and after-focus) impinge onto the same location on the lens at different angles, these beams are differently refracted by the focusing lens. The slits are located so as to pick up the light components propagating within the paraxial and periphery regions of the optical axis. Therefore, a certain phase difference exists between the light emerging respectively from the slits 35a and 35b, as well as between the light emerging respectively from the slits 35c and 35b. The optics 30 creates a magnified image of the aperture stop 16 in the slits' plane $CP_1$. To this end, the short slits 35a and 35c are provided at those locations on the plate 35 that interact with the light components representative of the magnified images of the regions $R_1$ (in accordance with the known image magnification produced by the lens arrangement 30).

Since the width of the slits is very small (about 5 $\mu$m), the light ensuing from the slits will be diffracted in the Y-direction. Light components ensuing from the upper slit 35a and from the respective half of the central slit 35c will interfere on the sensing surface 21 of the CCD, and will produce an interference pattern $IM_1$. Similarly, light ensuing from the lower slit 35c and from the other half of the central slit 35b will interfere and produce an interference pattern $IM_2$.

Thus, two images $IM_1$ and $IM_2$ are obtained on the sensing surface 21 of the CCD camera, actuating corresponding sensing elements, each representing a pixel of the image. Each of the images is the interference pattern formed by interference of the light components picked up by the corresponding short slit and the half of the central slit.

Owing to the above design of the optical system 9 and the appropriate accommodation of the sensing surface 21, each of the finally obtained images $IM_1$ and $IM_2$ contains information indicative of the image of the aperture stop 16 formed by the light component propagating within a corresponding one of the periphery regions $R_1$; the image of the scan line S along the Z-axis; the image of the corresponding interference pattern along the X-axis; and the phase difference between the light components forming this interference pattern.

Figure 4:
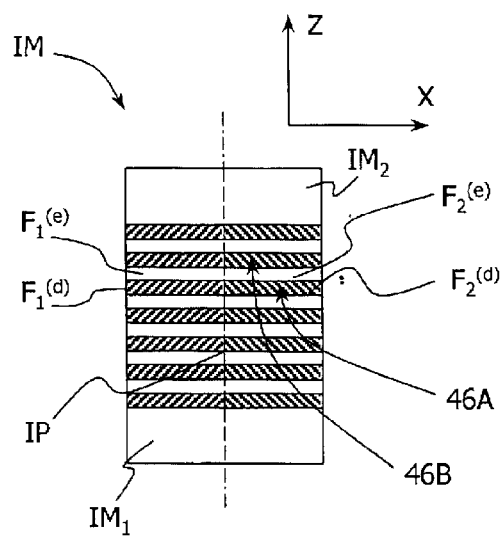
FIG. 4 illustrates an image obtained with the focus detection unit of FIG. 2 corresponding to the in-focus position of the article.

FIGS. 4, 5a–5b, and 6a–6b illustrate in-focus and two out-of-focus situations as detected by the CCD 20. FIG. 4 shows the entire image IM formed of two image-parts $IM_1$ and $IM_2$. Each of the image-parts is the interference pattern, i.e., an array of "dark" and "light" fringes. The two images $IM_1$ and $IM_2$ are displaced with respect to each other only along the X-axis, namely, each two "dark" fringes $F^{(d)}_1$ and $F^{(d)}_2$ (corresponding to the maximum intensity of the output signal) in the two patterns $IM_1$ and $IM_2$, respectively, are aligned in a line 46a, and each two "light" fringes $F^{(1)}_1$ and $F^{(1)}_2$ (corresponding to the minimum intensity of the output signal) in the two patterns are aligned in a line 46b. This relative position of the image-parts $IM_1$ and $IM_2$ corresponds to the desired in-focus position of the wafer's surface 2a, the so-called "best focus". Before the detection procedure begins, the "best focus" should be found.

Figure 5A:
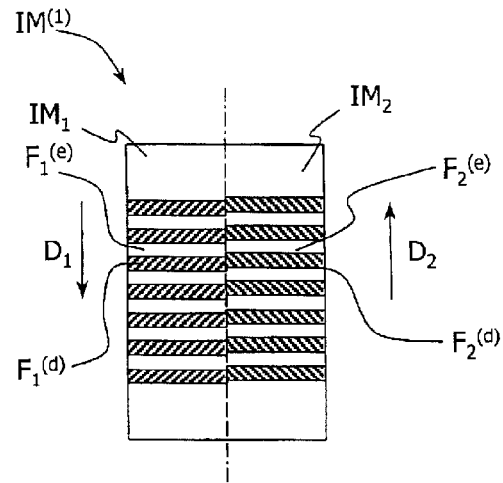
FIGS. 5a and 5b illustrate, respectively, the entire image obtained with the focus detection unit, and a corresponding graph representative of the output signal of a detector, which correspond to one out-of-focus position of the article.
Figure 5B:
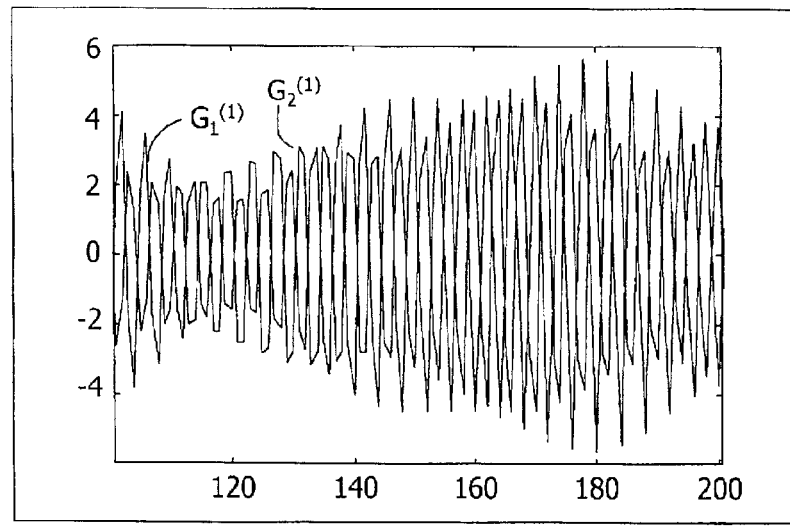

FIGS. 5a and 5b illustrate, respectively, the entire image $IM^{(1)}$ formed by two image-parts $IM_1$ and $IM_2$, and graph $G_1^{(1)}$ and $G_2^{(1)}$ representative of the corresponding output signal of the CCD. This situation corresponds to one out-of-focus position of the wafer's surface 2a (e.g., after-focus position). As shown in FIG. 5a, when the wafer moves out of focus in one direction, the image-parts $IM_1$ and $IM_2$ displace in two opposite directions $D_1$ and $D_2$, respectively, being spaced from each other in the X- and Y-axes. Fringes $F^{(d)}_1$ and $F^{(d)}_2$ (and $F^{(1)}_1$ and $F^{(1)}_2$) are displaced from each other a certain distance. This displacement occurs because the light beams returned from the wafer now impinge onto the focusing/collecting lens at different angles (as compared to the situation of FIG. 4), and are therefore differently refracted by the lens. The angles of incidence of the beams onto the slits' plane define the intensity pattern structure in the output interference patterns.

The sensing elements of the CCD camera 20 operate in a conventional manner to produce electrical signals in response to the sensed light and to transmit the electrical signals to the output circuit 22. In FIG. 5b, curves $G_1^{(1)}$ and $G_2^{(1)}$ represent the intensity distribution of the output signal corresponding to the image parts $IM_1$ and $IM_2$, respectively. As shown, a certain phase difference exists between the two output signals. Since the phase difference can be estimated very accurately, the technique of the present invention enables very accurate estimation of the focus error.

Thus, the processor 24 analyzes the output signals coming from the detector 20 and generates the focus correction signal, optionally, concurrently presenting the entire image $IM^{(1)}$ on the display 26. In response to the focus correction signal, the servomotor 18 operates accordingly to provide the necessary displacement of the wafer 2 with respect to the focal plane of the objective lens 16.

Figure 6A:
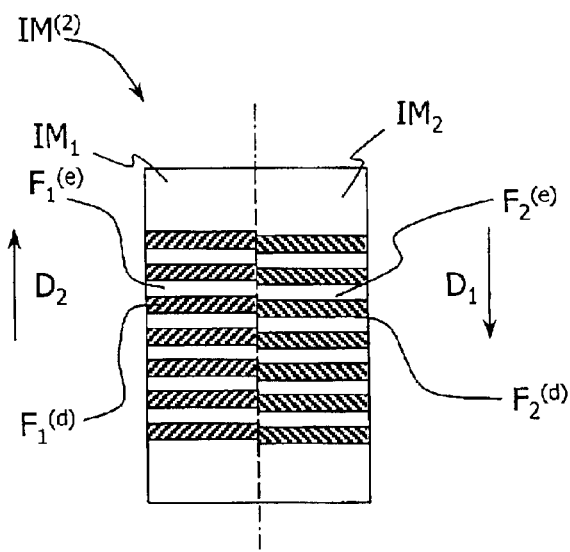
FIGS. 6a and 6b illustrate, respectively, the entire image obtained with the focus detection unit, and a corresponding graph representative of the output signal of the detector, which correspond to another out-of-focus position of the article.
Figure 6B:
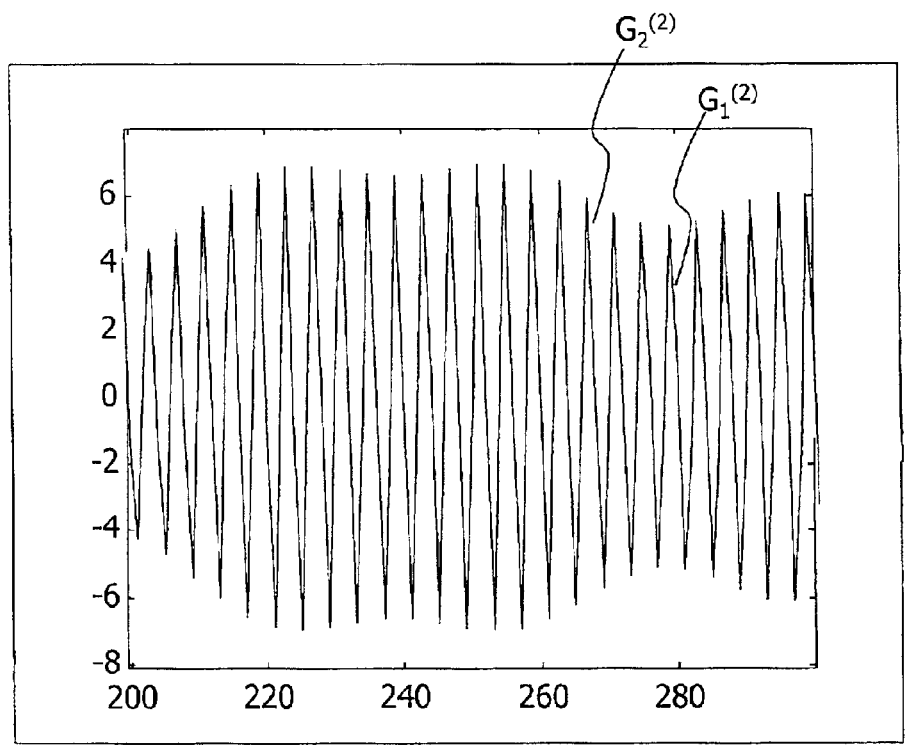

FIGS. 6a and 6b illustrate, respectively, the entire image $IM^{(2)}$ formed by two image-parts $IM_1$ and $IM_2$, and graphs $G_1^{(2)}$ and $G_2^{(2)}$ representative of the corresponding output signal of the CCD. This situation corresponds to another out-of-focus position of the wafer's surface 2a (e.g., before-focus position). As shown in FIG. 6a, when the wafer moves out of focus in the other opposite direction, the image-parts $IM_1$ and $IM_2$ displace in the directions $D_2$ and $D_1$, respectively.

The apparatus 1a is tested before the detection procedure. That is, a so-called learning mode is applied in order to detect which one of the situations shown in FIGS. 5a–5b and 6a–6b corresponds to the "before-focus" location, and which one corresponds to the "after-focus" location of the surface 2a.

It should be noted that the technique of the present invention actually presents dynamic auto-focusing, namely, the auto-focus detection should preferably be performed continuously during the processing of an article (e.g., inspection of wafers). When the upper and lower slits 35a and 35c are placed so as to pick up the light components propagating substantially at the edges of the aperture stop 16, one depth-of-focus error gives a $\pi/2$ phase shift of the fringes $F^{(d)}_1$ and $F^{(d)}_2$ (and $F^{(1)}_1$ and $F^{(1)}_2$).

Figure 7:
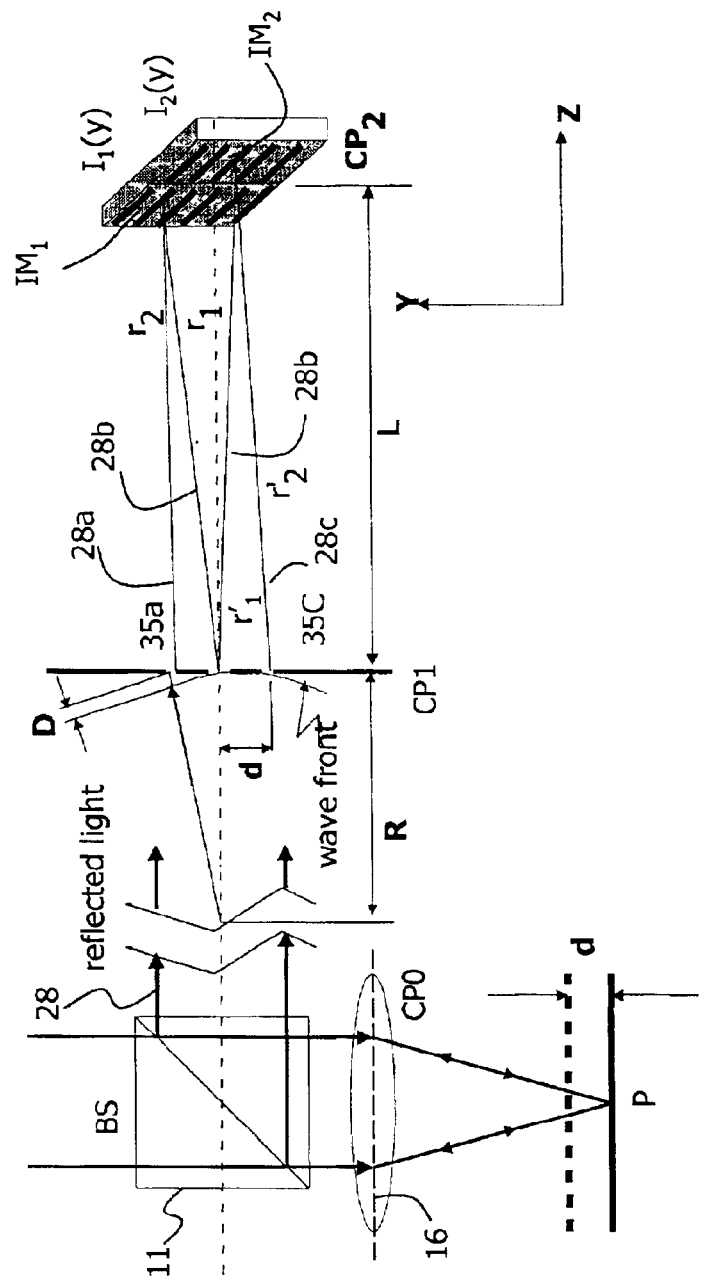
FIG. 7 more specifically illustrates the light propagation through the optical system of FIG. 2 considered for the calculation of the light intensity on a detector plane.

The calculation of the light intensity on the CCD plane will now be explained with reference to FIG. 7 showing schematically the light propagation through the optical system 9. In the figure:

$r_1$ and $r_2$ are the lengths of the optical paths passed by two collected light components 28b and 28a, which emerge from the central slits 35b and the upper short slit 35a, respectively, and interact in the CCD plane $CP_2$ to form the fringe of the interference pattern $IM_1$;

$r'_1$ and $r'_2$ are the lengths of the optical paths passed by two collected light components 28b and 28c, which emerge from the central slit 35b and the lower short slit 35c, respectively, and interact in the CCD plane $CP_2$ to form the fringe of the interference pattern $IM_2$;

d is the distance (along the Y-axis) between the central long slit 35b and each of the short slits 35a and 35c;

L is the distance (along the Z-axis) between the blocking plate 35 and the CCD plane $CP_2$, and $\delta$ is the defocus (i.e., the distance between the current location of the wafer and the focal plane P.

If $I_1(y)$ is the intensity of the interference pattern formed by light emitted from the central slit 35b and light emitted from the upper short slit 35a, and $I_2(y)$ is the intensity of the interference pattern formed by light emitted from the central slit 35b and light emitted from the lower short slit 35c, these intensities as functions of the defocus $\delta$ are as follows:

$$I_1(y) = \left|A \cdot \cos\left(\left(\frac{2\pi}{\lambda}(|r_1| - |r_2| - \Delta)\right)\right)\right|^2$$

$$I_2(y) = \left|A \cdot \cos\left(\left(\frac{2\pi}{\lambda}(|r'_1| - |r'_2| - \Delta)\right)\right)\right|^2$$

Using simple geometry, the argument of the cos-function can be approximated as follows:

$$|r_1| - |r_2| = L \cdot \left[\sqrt{1 + \left(\frac{y}{L}\right)^2} - \sqrt{1 + \left(\frac{y-d}{L}\right)^2}\right] \cong \frac{d}{L}\left(y - \frac{d}{2}\right)$$

$$|r'_1| - |r'_2| = L \cdot \left[\sqrt{1 + \left(\frac{y}{L}\right)^2} - \sqrt{1 + \left(\frac{y+d}{L}\right)^2}\right] \cong \frac{d}{L}\left(-y - \frac{d}{2}\right)$$

Using the principles of geometrical optics, $\alpha(\delta)$ may be approximated as follows:

$$\Delta = R - \sqrt{R^2 + d^2} \cong \frac{1}{2} \cdot \frac{d^2}{R}$$

wherein:

$$\frac{1}{f} = \frac{1}{f+d} + \frac{1}{R}; \Rightarrow R \cong \frac{f^2}{\delta}; \Rightarrow \Delta \cong \frac{1}{2} \cdot \frac{d^2}{f^2} \cdot \delta$$

In view of the above, the intensity profiles as functions of defocus in two images $IM_1$ and $IM_2$ are as follows:

$$I_1(y, \delta) = \left|A \cdot \cos\left(\frac{2\pi}{\lambda} \cdot \left[\frac{d}{L}\left(\frac{d}{2} - y\right) + \frac{1}{2} \cdot \frac{d^2}{f^2} \cdot \delta\right]\right)\right|^2$$

$$I_2(y, \delta) = \left|A \cdot \cos\left(\frac{2\pi}{\lambda} \cdot \left[\frac{d}{L}\left(\frac{d}{2} + y\right) + \frac{1}{2} \cdot \frac{d^2}{f^2} \cdot \delta\right]\right)\right|^2$$

Thus, the relation between the two intensity profiles as measured on the CCD enables determination of the position of the wafer 2 relative to the focal plane P (i.e., the defocus $\delta$).

FIGS. 8a–8b and 9a–9b illustrate two possible examples, respectively, of the slits' arrangement within the blocking plate, aimed at extending the dynamic range of the detected signals. In both examples, the so-called "double slit" arrangement is used, i.e., two pairs of "short slits" are provided in a blocking plate at opposite sides, respectively, of a central "long" slit.

Figure 8A:
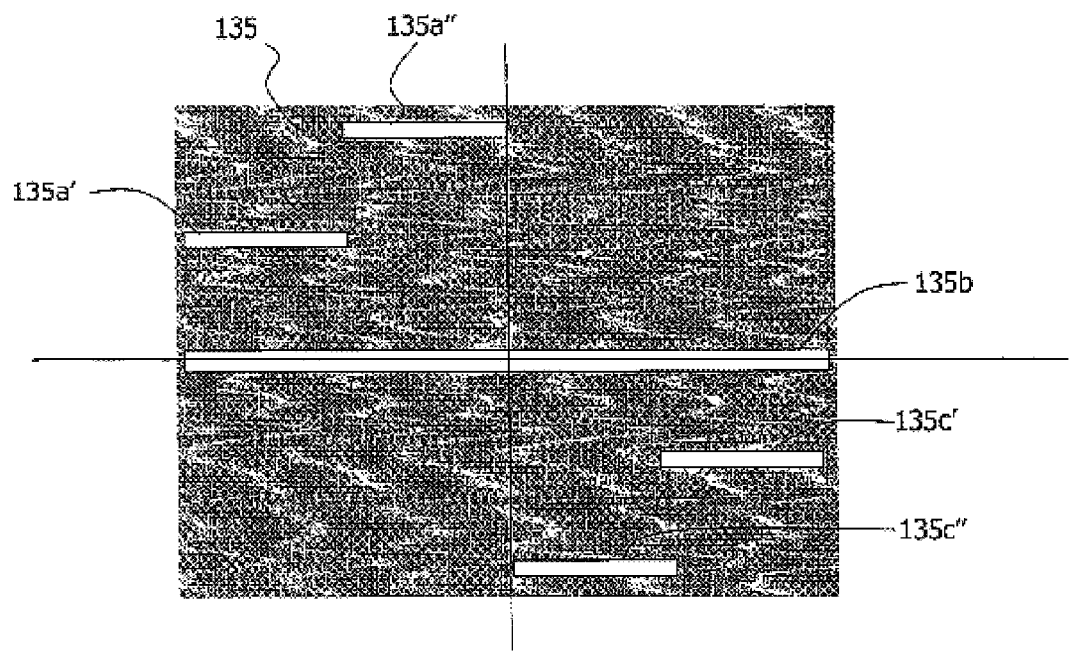
FIGS. 8a and 8b illustrate another possible example of a blocking plate suitable for use in the focus detection unit of FIG. 2.
Figure 8B:
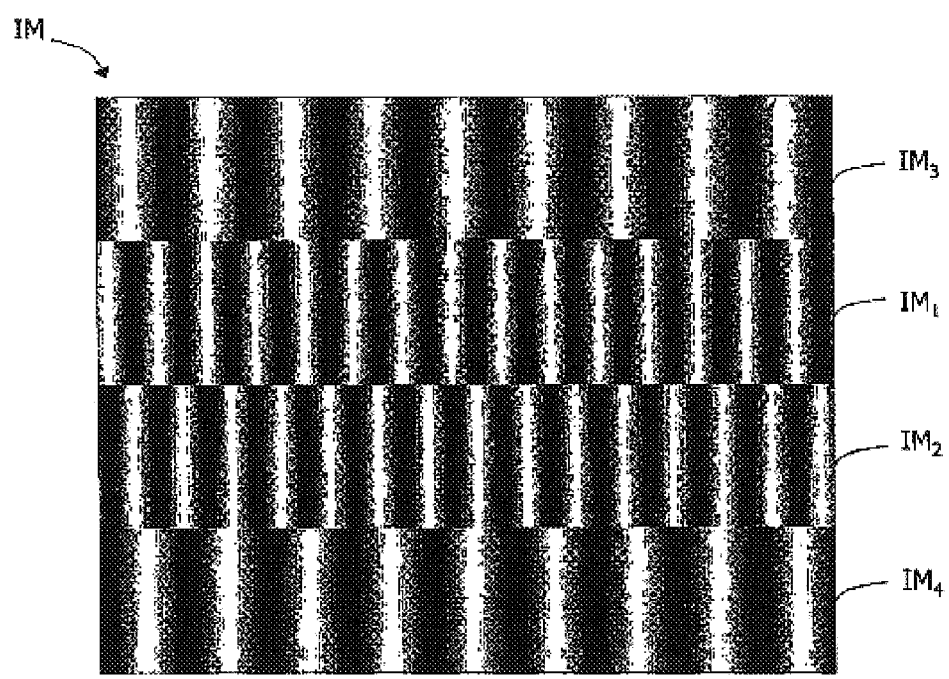

As shown in FIG. 8a, a blocking plate 135 (to be accommodated in the optical path of light entering the optical system 9) is formed with a central long slit 135b, and two pairs of short slits 135a'–135a" and 135c'–135c". The slits all are arranged so that they are in a spaced-apart parallel relationship along the Y-axis, and the two pairs of short slits, as well as the short slits within each pair, are spaced with respect to each other along both the Y- and the X-axes. FIG. 8b illustrates an image IM (as obtained on the CCD) composed of four patterns (image parts) $IM_1$–$IM_4$. The interference patterns $IM_1$ and $IM_2$ are formed by interference between the light components ensuing from the central slit 135b and each if the inner slits 135a' and 135c', respectively. The interference patterns $IM_3$ and $IM_4$ are formed by interference between the light emitted from the central slit 135*b*, and each of the outer slits 135*a*" and 135*c*", respectively. As shown, the inner slits 135*a*' and 135*c*' provide high sensitivity patterns and low dynamic range, and the outer slits 135*a*' and 135*c*' provide low sensitivity patterns and large dynamic range.

Figure 9A:
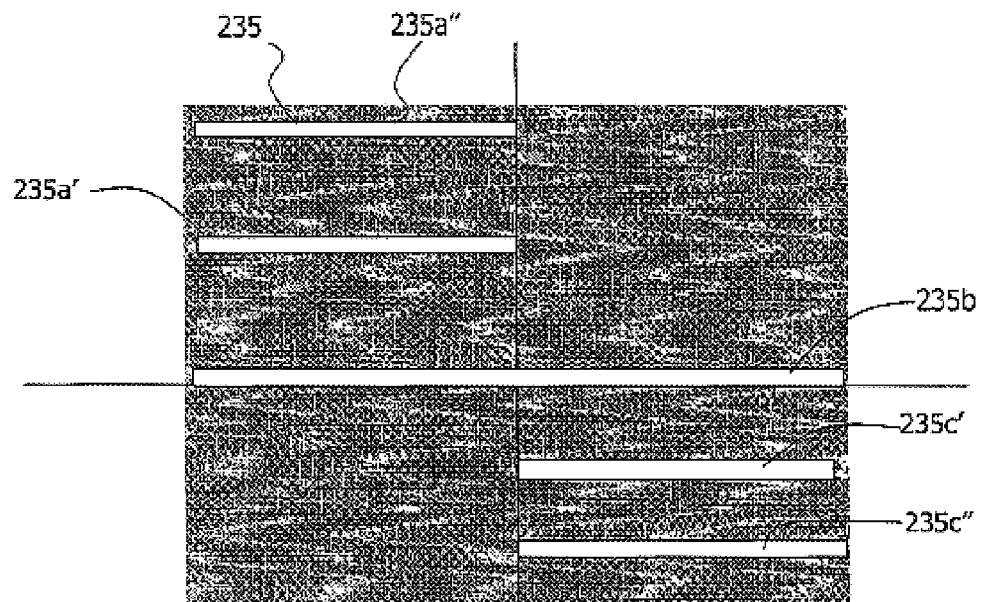
FIGS. 9a and 9b illustrate yet another possible example of a blocking plate suitable for use in the focus detection unit of FIG. 2.
Figure 9B:
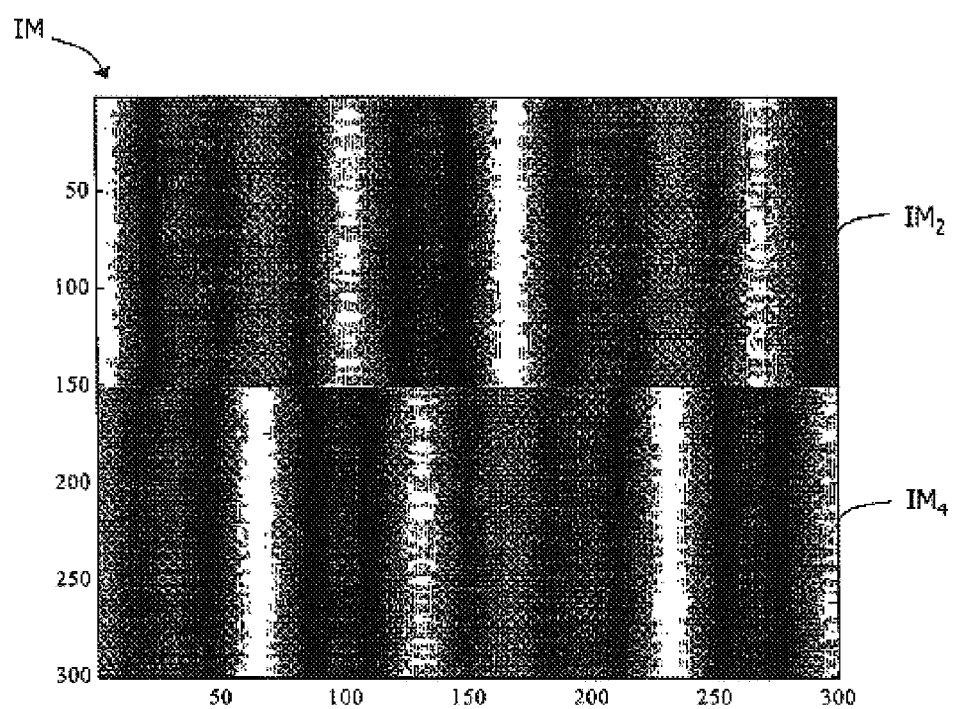

In the example of FIGS. 9*a*–9*b*, a blocking plate 235, similar to the above-described example, is formed with a central long slit 235*b*, and two pairs of short slits 235*a*'–235*a*" and 235*c*'–235*c*". Here, as distinguished from the previous example, the two short slits of each pair are spaced with respect to each other only along the Y-axis. The provision of inner slits 235*a*' and 235*c*, and outer slits 235*a*– and 235*c*" provide a similar result: a high spatial frequency pattern with low resolution and large dynamic range, and a low spatial frequency pattern with low resolution and large dynamic range. However, as shown in FIG. 9*b*, each of the two image parts (interference pattern) $IM_1$ and $IM_2$ is a superposition of two images produced by light components ensuing from the slits 235*a*' and 235*a*' (and 235*c*' and 235*c*").

Those skilled in the art will readily appreciate that various modifications and changes may be applied to the preferred embodiments of the invention as hereinbefore exemplified without departing from its scope as defined in and by the appended claims. For example, the article to be maintained at a desired position may be an information carrier, and the surface to be maintained in the focal plane may be that defined by an addressed information layer.

What is claimed is:

1. An optical apparatus for determining a position of an article, the apparatus comprising an illumination unit, focusing optics and a focus detection unit, wherein:

the illumination unit is operable to generate incident light and illuminate an elongated region of the article for producing light returned from the illuminated region;

the focusing optics directs the incident light towards the article and directs at least a portion of the returned light toward the focus detection unit; and the focus detection unit comprises an optical system and a detector, the optical system being operable to collect the directed portion of the returned light and create at least two images on a sensing surface of the detector in the form of at least two interference patterns, respectively, wherein at least one pattern is created by interference between:

light components of the collected light that propagated within a first periphery region of an optical axis of the focusing optics; and light components of the collected light that propagated within a paraxial region of said optical axis, and wherein at least one other interference pattern is created by interference between:

light components of the collected light that propagated within a second periphery region of said optical axis, substantially symmetrical to said first periphery region with respect to said optical axis; and light components of the collected light that propagated within the paraxial region of said optical axis; and wherein data representative of a relation between intensity profiles in the at least two interference patterns is indicative of the position of the article relative to a focal plane of said focusing optics.

2. The apparatus according to claim 1, wherein said at least two images are spaced from each other along an X-axis parallel to the illuminated elongated region, such that each two corresponding dark fringes in the two interference patterns and each two corresponding light fringes in the patterns are aligned in two lines, respectively, when in the desired in-focus position of the illuminated region, and, when in two positions of the illuminated region at opposite sides of the focal plane, the at least two images are differently spaced from each other along the X-axis and along a Y-axis, perpendicular to the elongated region, in accordance with a phase difference between the collected light components propagating within the paraxial region and the collected light components propagating within the periphery regions.

3. The apparatus according to claim 1, wherein said optical system comprises a blocking plate, which is located in an X-Y plane perpendicular to an optical axis of the optical system, and is formed with at least three parallel transmitting slits sufficiently thin to provide diffraction of light emerging therethrough for picking up at least three light components of the collected light, respectively, which form said at least two interference patterns, the slits extending along the X-axis parallel to the elongated region, and being aligned in a spaced-apart parallel relationship along the Y-axis, such that the optical axis of the optical system intersects with an axis of a central slit, and at least two side slits are centrally symmetrical relative to an intersection point of said optical axis of the optical system and the X-Y plane and are spaced from each other along the X- and Y-axes.

4. The apparatus according to claim 3, wherein the blocking plate is formed with at least two additional spaced-apart parallel side slits extending along the X-axis, the at least four side slits forming two pairs of side slits located at opposite sides of the central slit, respectively.

5. The apparatus according to claim 4, wherein each two side slits located at one side of the central slit are spaced-apart from each other and from the central slit along the Y-axis.

6. The apparatus according to claim 5, wherein each two side slits located at one side of the central slit are spaced-apart from each other along the X-axis.

7. The apparatus according to claim 6, wherein the optical system forms four interference patterns.

8. The apparatus according to claim 3, wherein the X-Y plane in which the slits are located is conjugate to a plane of an aperture stop defined by the focusing optics.

9. The apparatus according to claim 3, wherein said optical system further comprises:

a first lens assembly accommodated upstream of the blocking plate and collecting said at least portion of the returned light, the first lens assembly being capable of forming an image of an aperture stop defined by the focusing optics in a first plane conjugate to the aperture stop plane along the X-axis, the blocking plate being located in said first conjugate plane;

a second lens assembly accommodated downstream of the blocking plate, and being capable of forming an image of the illuminated region along the Y-axis in a second plane conjugate to the aperture stop plane along the X-axis; and a third lens assembly receiving light emerging from the second assembly and forming images of said at least three slits along the X-axis in the second conjugate plane of the aperture stop.

10. The apparatus according to claim 9, wherein said sensing surface is located in the second conjugate plane.

11. The apparatus according to claim 1, further comprising a display coupled to an output of the detector for displaying said first and second images.

12. The apparatus according to claim 1, further comprising a processor coupled to an output of the detector for receiving data representative of said at least two images and generating output signals indicative of said position of the article relative to the focal plane.

13. The apparatus according to claim 12, wherein said processor generates a focus error correction signal for providing relative displacement between the article and the focusing optics to maintain the illuminated region within the focal plane.

14. The apparatus according to claim 1, further comprising a feedback loop, responsive to said output signals, for generating a focus error correction signal and adjusting the relative position of the article relative to the focusing optics to place the illuminated region in the focal plane of the focusing optics.

15. A system for an optical inspection of an article, comprising an optical apparatus for maintaining a desired position of the article, and at least one detection unit, wherein said optical apparatus comprises:

an illumination unit operable to generate incident light and illuminate an elongated region of the article for producing light returned from the illuminated region;

focusing optics that directs the incident light towards the article and directs at least a portion of the returned light towards a focus detection unit;

said focus detection unit comprising an optical system and a detector, the optical system being operable to collect the directed portion of the returned light and create at least two images on a sensing surface of the detector in the form of at least two interference patterns, respectively;

wherein at least one pattern is created by interference between:

light components of the collected light that propagated within a first periphery region of an optical axis of the focusing optics; and light components of the collected light that propagated within a paraxial region of said optical axis; and wherein at least one other interference pattern is formed by interference between:

light components of the collected light that propagated within a second periphery region of said optical axis, substantially symmetrical to said first periphery region with respect to said optical axis; and light components of the collected light that propagated within the paraxial region of said optical axis of the focusing optics; and wherein data indicative of a relation between intensity profiles in the at least two interference patterns is indicative of the position of the article relative to a focal plane of the focusing optics; and wherein said at least one detection unit comprises light collecting optics and a detector, the light collecting optics being capable of collecting light returned from the article at elevation angles different from an elevation angle of collection of said at least portion of the returned light defined by said focusing optics.

16. A focus error detection method comprising:

passing incident light through focusing optics and illuminating an elongated region, thereby producing light returned from the illuminated region;

collecting at least a portion of the light returned from said illuminated region and passed through said focusing optics;

picking up at least three spatially separated light components of the collected returned light, so as to cause diffraction of each of said light components and to allow:

interference between a central light component that propagated within a paraxial region of an optical axis of the focusing optics and at least one first light component that propagated within a first periphery region of said optical axis of the focusing optics; and interference between said central light component and at least one second light component of the collected returned light that propagated within a second periphery region of said optical axis of the focusing optics substantially symmetrical to said first periphery region with respect to said optical axis; and creating at least two images in the form of at least two interference patterns, respectively, on a sensing surface of a detector, said at least two interference patterns being created by the interference of the separated light components, a relation between intensity profiles in the interference patterns being indicative of the position of the illuminated region relative to a focal plane of said focusing optics.

17. The method according to claim 16, wherein said at least two images are spaced from each other along an X-axis parallel to the illuminated elongated region, such that each two corresponding dark fringes in the two interference patterns and each two corresponding light fringes in the patterns are aligned in two lines, respectively, when in the desired in-focus position of the illuminated region, and, when in two positions of the illuminated region at opposite sides of the focal plane, the images are differently spaced from each other along the X-axis and along a Y-axis perpendicular to the illuminated region in accordance with phase difference between the light components propagating within the paraxial region and the light components propagating within the periphery regions.

18. A method of maintaining a desired position of an article during processing of the article, the method comprising:

(a) generating an incident beam and illuminating an elongated region of the article to produce light returned from the illuminated region;

(b) directing the incident light toward the article through focusing optics, and collecting with focusing optics at least a portion of the returned light and directing it towards a focus detection unit, said focusing optics defining an aperture stop of light collection;

(c) creating from the collected returned light at least two images of the illuminated region in the form of at least two interference patterns, respectively, said at least two interference patterns being formed by:

interference between a central light component of the collected light that propagated within a paraxial region of an optical axis of the focusing optics and at least one first light component of the collected light that propagated within a first periphery region of the optical axis of the focusing optics, and interference between said central light component and at least one second light component of the collected light that propagated within a second periphery region of the optical axis of the focusing optics substantially symmetrical to said first periphery region with respect to said optical axis;

(d) detecting light indicative of said at least two images; and (e) based on said detecting, determining a relation between intensity profiles in the at least two interference patterns, and determining a relative position of the article with respect to a focal plane of the focusing optics, thereby enabling maintenance of the desired position of the article.

19. The method according to claim 18, wherein the formation of said at least two interference patterns comprises directing the collected returned light along an optical axis of light propagation and passing the collected returned light through at least three transmitting slits, which are sufficiently thin to provide diffraction of light emerging therethrough and are made in a blocking plate located in an X-Y plane, which is perpendicular to said optical axis of light propagation and is conjugate to a plane of the aperture stop, the slits being aligned in a spaced-apart parallel relationship along the Y-axis, such that said optical axis of light propagation intersects with an axis of a central slit, and at least two side slits are centrally symmetrical relative to an intersection point of said optical axis of light propagation and the X-Y plane where the slits are located, and are spaced from each other along the X- and Y-axes.

* * * * *